(12) United States Patent
Lindert et al.

(10) Patent No.: US 9,565,766 B2
(45) Date of Patent: Feb. 7, 2017

(54) FORMATION OF DRAM CAPACITOR AMONG METAL INTERCONNECT

(75) Inventors: Nick Lindert, Beaverton, OR (US); Joseph M. Steigerwald, Forest Grove, OR (US); Kanwal Jit Singh, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 103 days.

(21) Appl. No.: 13/976,085

(22) PCT Filed: Oct. 7, 2011

(86) PCT No.: PCT/US2011/055422
§ 371 (c)(1),
(2), (4) Date: Jun. 26, 2013

(87) PCT Pub. No.: WO2013/052067
PCT Pub. Date: Apr. 11, 2013

(65) Prior Publication Data
US 2013/0271938 A1    Oct. 17, 2013

(51) Int. Cl.
*H05K 1/18* (2006.01)
*H01L 27/108* (2006.01)
(Continued)

(52) U.S. Cl.
CPC ............... *H05K 1/182* (2013.01); *H01L 28/91* (2013.01); *H01L 23/5223* (2013.01);
(Continued)

(58) Field of Classification Search
CPC .......... H01L 28/55; H01L 28/75; H01L 28/87; H01L 28/90; H01L 28/91; H01L 27/10855; H01L 27/10861; H01L 27/10864; H01L 27/10867
(Continued)

(56) References Cited

U.S. PATENT DOCUMENTS 5,671,175 A    9/1997   Liu et al.
5,990,510 A    11/1999  Choi et al.
(Continued)

FOREIGN PATENT DOCUMENTS

CN    1378273 A      11/2002
KR    10-0258884 B1   6/2000
(Continued)

OTHER PUBLICATIONS

Office Action received for DE Application No. 112011105710.5, dated Oct. 7, 2014. 8 pages of English translation.
(Continued)

*Primary Examiner* — Binh Tran
(74) *Attorney, Agent, or Firm* — Finch & Maloney PLLC

(57) ABSTRACT

Techniques are disclosed for integrating capacitors among the metal interconnect for embedded DRAM applications. In some embodiments, the technique uses a wet etch to completely remove the interconnect metal (e.g., copper) that is exposed prior to the capacitor formation. This interconnect metal removal precludes that metal from contaminating the hi-k dielectric of the capacitor. Another benefit is increased height (surface area) of the capacitor, which allows for increased charge storage. In one example embodiment, an integrated circuit device is provided that includes a substrate having at least a portion of a DRAM bit cell circuitry, an interconnect layer on the substrate and including one or more metal-containing interconnect features, and a capacitor at least partly in the interconnect layer and occupying space from which a metal-containing interconnect feature was removed. The integrated circuit device can be, for example, a processor or a communications device.

31 Claims, 5 Drawing Sheets

(51) Int. Cl.
    *H01L 49/02*     (2006.01)
    *H01L 23/522*     (2006.01)
    *H01L 23/532*     (2006.01)

(52) U.S. Cl.
    CPC .. *H01L 23/53238* (2013.01); *H01L 27/10855* (2013.01); *H01L 28/55* (2013.01); *H01L 28/75* (2013.01); *H01L 28/87* (2013.01); *H01L 28/90* (2013.01); *H01L 2924/0002* (2013.01)

(58) Field of Classification Search
    USPC ............... 257/E21.009, E21.011, E21.012, 257/E21.018, E21.019, E21.021, E21.579, 257/E21.582, E21.585, E21.649, E21.658, 257/E21.66, 758; 438/253, 700, 702; 361/271, 763, 764
    See application file for complete search history.

(56) References Cited

U.S. PATENT DOCUMENTS

| | | | |
|---|---|---|---|
| 6,180,485 B1 | 1/2001 | Parekh et al. | |
| 6,271,084 B1 | 8/2001 | Tu et al. | |
| 6,344,389 B1 | 2/2002 | Bronner et al. | |
| 6,445,023 B1 * | 9/2002 | Vaartstra et al. | 257/295 |
| 6,528,366 B1 | 3/2003 | Tu et al. | |
| 6,559,499 B1 | 5/2003 | Alers et al. | |
| 6,635,528 B2 * | 10/2003 | Gilbert | H01L 21/32139 257/E21.009 |
| 6,737,356 B1 | 5/2004 | Dow | |
| 6,794,694 B2 | 9/2004 | Diodato et al. | |
| 8,258,039 B2 * | 9/2012 | Inoue | H01L 27/105 257/296 |
| 2002/0079522 A1 | 6/2002 | Diodato et al. | |
| 2004/0232557 A1 | 11/2004 | Kim | |
| 2011/0079836 A1 | 4/2011 | Lin | |
| 2011/0227194 A1 | 9/2011 | Jeannot et al. | |

FOREIGN PATENT DOCUMENTS

| | | |
|---|---|---|
| KR | 10-2009-0059654 A | 6/2009 |
| WO | 2013/052067 A1 | 4/2013 |

OTHER PUBLICATIONS

International Search Report and Written Opinion received for PCT Patent Application No. PCT/US2011/055422, mailed on May 14, 2012, 12 pages.

Korczynski, et al., "NAND Flash and DRAM evolutions-Beta-Blog," retrieved from: http://www.betasights.net/wordpress/?p=1238, Jan. 7, 2011, 4 pages.

Berthelot, et al., "Highly Reliable TiN/ZrO2/TiN 3D Stacked Capacitors for 45 nm Embedded DRAM Technologies," retrieved from: http://www.freescale.com/files/technology_publications/doc/Papers/Eintel15347.pdf; Freescale Semiconductors Inc., Sep. 2006, 4 pages.

"NEC Electronics eDRAM Process Advantages," Renesas Electronics Corporation, Retrieved from: http://www2.renesas.com/process/en/edramprocess.html, Sep. 19, 2011, 4 pages.

Park, et al., "Novel Robust Structure and High k Dielectric Material for 90 nm DRAM Capacitor," Journal of Semiconductor Technology and Science, Jun. 2003, vol. 3, No. 2, pp. 76-82.

International Preliminary Report on Patentability and Written Opinion received for PCT Patent Application No. PCT/US2011/055422, mailed on Apr. 17, 2014, 8 pages.

Office Action received for DE Application No. 112011105710.5, dated Oct. 7, 2014. 10 pages with 3 pages of English translation.

* cited by examiner

FORMATION OF DRAM CAPACITOR AMONG METAL INTERCONNECT

BACKGROUND

A dynamic random access memory (DRAM) generally includes an array of bit cells, each cell capable of storing a bit of information. A typical cell configuration consists of a capacitor for storing a charge (i.e., the bit of information) and an access transistor that provides access to the capacitor during read and write operations. The access transistor is connected between a bitline and the capacitor, and is gated (turned on or off) by a wordline signal. During a read operation, the stored bit of information is read from the cell via the associated bitline. During a write operation, a bit of information is stored into the cell from the bitline via the transistor. The cells are dynamic in nature (due to leakage), and therefore must be periodically refreshed.

Embedded DRAM (eDRAM), where the capacitor is integrated on the same die as the processor (or other functional circuit having the DRAM), is implemented in a stacked configuration. Such stacked solutions are generally associated with a number of non-trivial problems.

Figure 1:
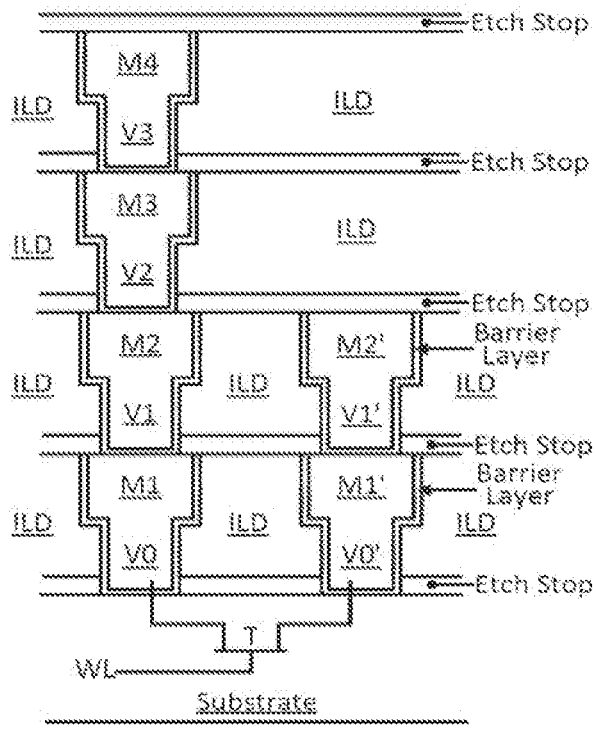
FIG. 1 illustrates a stacked DRAM device prior to formation of the capacitor, in accordance with an embodiment of the present invention.

As will be appreciated, the figures are not necessarily drawn to scale or intended to limit the claimed invention to the specific configurations shown. For instance, while some figures generally indicate straight lines, right angles, and smooth surfaces, an actual implementation of a memory device may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques are disclosed for integrating capacitors among the metal interconnect for embedded DRAM applications. In some embodiments, the technique uses a wet etch to completely remove the interconnect metal (e.g., copper) that is exposed prior to the capacitor formation. This interconnect metal removal precludes that metal from contaminating the hi-k dielectric of the capacitor. Another benefit is increased height (surface area) of the capacitor, which allows for increased charge storage. Various other advantages will be apparent in light of this disclosure.

General Overview

As previously explained, stacked DRAM solutions are generally associated with a number of non-trivial problems. For instance, in capacitor over bitline (COB) configurations, stacked DRAM capacitors are formed above the transistor in the back-end interconnect portion of the process flow. Typically, the DRAM capacitor is integrated before the use of copper (which is commonly used as an interconnect metal). However, and in accordance with an embodiment of the present invention, the DRAM capacitor is integrated after and among the copper metal interconnect lines, where the capacitor is integrated in the same layers as logic metal lines.

Because of this integration scheme, contamination of the capacitor's hi-k dielectric by the copper (or other interconnect metal) is a concern. This contamination can be avoided, for instance, by depositing a thick conformal diffusion barrier layer (e.g., tantalum or other suitable barrier material) as part of the bottom electrode of the capacitor and before depositing the hi-k capacitor material. However, such diffusion barrier techniques are increasingly more difficult to implement with scaling to higher aspect ratios, and can also be costly to implement. In contrast, the techniques provided herein can be used to allow for a relatively inexpensive and straightforward solution, and may also provide more surface area for the capacitor (so as to increase capacitance).

In more detail, and in accordance with one example embodiment, the contamination source (e.g., copper or other interconnect metal) is eliminated or otherwise substantially reduced by removing the metal landing pad for the DRAM capacitor, or other such contamination source. In one specific such embodiment, this removal is accomplished via wet etching the landing pad material below or otherwise proximate the capacitor trench, although other material removal techniques can be used as will be apparent in light of this disclosure (e.g., wet etch, dry etch, ablation, or combination of such processes). The etch can be selective to the underlying metal being removed, which in one example case is copper. Other materials of the structure remain intact. Removing the metal contamination source alleviates the need for diffusion barrier materials as pan of the capacitor stack.

In one specific example case, and after the capacitor patterning is performed in which the etch lands on a copper landing pad, the landing pad and its corresponding via copper is selectively wet etched away. This wet etch can be selective to all the materials used in the backend process, which in one example embodiment include interconnect berries materials (e.g., tantalum), etch stop materials (e.g., silicon nitride), and interlayer dielectric materials (e.g. silicon dioxide). The result of using such a selective etchant is that the optional interconnect barrier layer for each of the etched interconnect structures is left behind. This interconnect barrier layer blocks the wet etch from removing buried metal lines and also serves as the copper barrier to protect against copper diffusion from the buried metal lines to the capacitor dielectric. Note, however, that other embodiments of the present invention may not have an interconnect barrier layer.

Once the landing pad copper (or other targeted interconnect metal structure) is sufficiently removed, the bottom electrode of the capacitor can be deposited. In one example embodiment, a conformal atomic layer deposition (ALD) can be used to provide the bottom electrode of the capacitors for each cell. Subsequent capacitor processing can be implemented as normally done, which may generally include deposition of the capacitor high-k dielectric and top electrode, as well as any necessary metal contacts and interlayer dielectric material. Any number of other backend or finishing processes can be used (e.g., planarization, passivation, addition of subsequent layers or stacks, etc).

As will be appreciated in light of this disclosure, the capacitor can span one or more metal layers of a given structure, where each layer generally includes metal lines and/or vias for electrically connecting one layer to the next and/or to various electronic circuitry otherwise integrated into the overall structure. Thus, eDRAM capacitors can be integrated, for instance, into a back-end logic fabrication process for a processor (or other functional circuit) where the capacitors and various interconnect features (e.g., metal logic lines and vias, etc) share the same layers. By spanning the capacitor over multiple layers, greater capacitance levels can be achieved. The larger the capacitance of a given eDRAM cell, the greater the charge that can be stored by that cell. This higher charge allows for a longer capacitor leakage period before refresh is triggered.

As will be further appreciated in light of this disclosure, the layout design (with respect to, for instance, spacing and density of the capacitors and various interconnect structures making up the device) can vary from one application to the next, as well as from one layer to the next within any given device. Standard design layout techniques and practices can be used to efficiently utilize available die space, as normally done. With this in mind, note that the various example capacitor and landing pad/via layouts demonstrated herein merely illustrate example configurations and are not drawn to scale or otherwise intended to implicate any necessary spatial relationships or specific electrical connectivity between the layers and/or components shown. Other embodiments may use a DRAM interconnect layout having any landing pad/via configuration or other contaminant source interconnect structure associated with a capacitor to be formed.

Typical solutions for wet etching of interconnect metals such as copper use acids or chelators that dissolve metal indiscriminately along grain boundaries and exposed surfaces. In accordance with an embodiment of the present invention, the copper or other interconnect metal is removed with a wet etch process that uses a combination of etchant, oxidation and chelating passivators that bind the etched copper using heteroatoms and which then form a metal-organic passivation layer. In a more general sense, any heteroatom containing agent capable of forming a passivating polymeric network can be used in the etch process. In one specific example embodiment using copper as the interconnect metal and having an interconnect barrier layer underlying the copper, a cross-section view of the interconnect structure taken, for instance, with a scanning electron microscope (SEM) or transmission electron microscope (TEM) can be used to show the presence of underlying interconnect barrier layer where the DRAM capacitor copper landing pad or other associated structure used to be (prior to the selective wet etch process). In particular, the cross-section will generally show a capacitor structure and possible dielectric fill within the etched space.

DRAM Interconnect Structure and Methodology

FIGS. 1 through 6 effectively demonstrate a process flow for fabricating an eDRAM-based device in accordance with an embodiment of the present invention. Preliminary processing of the substrate and various interconnect layers are not expressly shown, but will be apparent in light of this disclosure. Such processing can be implemented, for instance, using any number of conventional or custom fabrication techniques as normally done. Numerous preliminary configurations will be apparent. The techniques provided herein can be employed on all such configurations.

FIG. 1 illustrates a partial cross-sectional side view of a stacked DRAM device prior to formation of the capacitor, in accordance with an embodiment of the present invention. As can be seen, this example device generally includes a substrate and a layered or stacked interconnect structure formed thereon. The device could be, for example, a central processing unit or any other functional circuit having on-board eDRAM (e.g., purpose-built or field programmable integrated circuit). Numerous applications will be apparent in light of this disclosure. Note that electronics in the substrate are shown in abstract schematic form to simplify the discussion where appropriate.

The substrate is configured with various DRAM cell components integrated therein, such as access transistor T and word line WL. As will be appreciated, the device may include a plurality of bit cells, with each cell generally including a storage capacitor communicatively coupled to a bitline by way of an access transistor that is gated by a word line. Other typical DRAM components and features not shown can also be included (e.g., row and column select circuitry, sense circuitry, power select circuitry, etc). Various degrees of integration can be used, and the claimed invention is not intended to be limited to any particular cell configuration or overall device configuration. In some example embodiments, standard metal oxide semiconductor (MOS) processing is used in forming the substrate circuitry, although any desired process technology can be used. In a more general sense, the substrate may be implemented as typically done, and any number of suitable substrate types and materials can be used here. The substrate may be, for example, a bulk semiconductor wafer (e.g., bulk silicon, germanium, gallium arsenide or other III-V materials, etc) or an on-insulator configuration (e.g., silicon on-insulator, germanium on-insulator, silicon germanium on-insulator, indium phosphide on-insulator, etc). The substrate may be p-type, n-type, neutral-type, high or low resistivity, off-cut or not off-cut, etc. The substrate may have a vicinal surface that is prepared by off-cutting the substrate from an ingot, wherein substrate is off-cut at an angle between, for instance, 2° and 8° (e.g., 4° off-cut silicon). Note, however, the substrate need not have any such specific features, and that the DRAM device can be implemented using numerous substrates. The substrate thickness can vary and in some embodiments, for example, is in the range of 100 nm to thousands of nanometers. In some cases, the substrate may be subsequently thinned or removed (e.g., by way of backside polish or other suitable thinning/removal process), after formation of the interconnect structure and application of protective layer such as etch stop, passivation layer, interlayer dielectric (ILD), capping layer, etc.

This example embodiment includes four stacked interconnect layers on top of the substrate, each layer including various metal lines (M1, M1', M2, M2', M3, and M4) and corresponding vias (V0, V0', V1, V1', V2, and V3) formed within an interlayer dielectric (ILD) material. As previously explained, note that the layout shown is not intended to implicate any particular feature spacing or density. Rather, this layout is simply an arbitrary example, and any number of other layout designs can benefit from an embodiment of the present invention, where a DRAM capacitor is formed in the capacitor trench as well as in the underlying interconnect feature space upon which the capacitor would have otherwise landed. Each layer is effectively isolated or otherwise demarcated from neighboring layers by an etch stop layer. In addition, each metal line and via of this example embodiment is configured with a barrier layer. Note that the locations where M3'/V2' and M4'/V3' would be located are not patterned and can be used for a cell capacitor as will be discussed in turn. Other embodiments may include fewer or more such layers.

As can be further seen in the cross-section side view, each metal line and via of this example configuration is implemented as a dual damascene structure fabricated in the corresponding dielectric layer (ILD). Other embodiments may employ other interconnect structures (e.g., single damascene or other suitable metal interconnect pathway where interconnect metal can be provisioned). The dual damascene trench can be formed in the dielectric layer, for example, using standard lithography including via and trench patterning and subsequent etch processes followed by polishing, cleans, etc, as typically done. The patterning and etch processes can be carried out, for instance, using wet and/or dry etch techniques. The trench and via dimensions can vary, depending on the application. In one example case, the upper trench opening is about 10 nm to 100 nm (e.g., 20 to 50 nm) and the lower via opening is about 5 nm to 50 nm (e.g. 10 to 25 nm), and the entire structure has an aspect ratio in the range of about 10:1 to 1.25:1 (e.g., 5:1). As will be appreciated, however, the dimensions and aspect ratio of the damascene trench will vary from one embodiment to the next, and the claimed invention is not intended to be limited to any particular range of dimensions, or any particular trench configuration. In a more general sense, note that the damascene trench or other metal interconnect pathway typically has a cross-sectional profile that shows sidewalls of the trench/pathway in addition to any top and bottom walls. In one example such embodiment, the trench/pathway may include sidewalls in just the longitudinal (vertical) plane, but other embodiments may include sidewalls in any combination of the longitudinal (vertical) plane, the latitudinal (horizontal) plane, and/or angled planes (any plane between horizontal and vertical planes). For instance, the example dual damascene trench as shown in FIG. 1 has sidewalls in both vertical and horizontal planes (which are in addition to top and bottom walls of the trench), given that the associated metal line (or landing pad) is wider than the underlying via. Any number of other metal interconnect trench/pathway configurations can be used, where at least one wall of the trench/pathway profile (e.g., as seen in cross-section) demonstrates intersecting planes. In another example case, the metal interconnect pathway cross-section demonstrates a profile having a first lateral width and a second lateral width that is smaller than the first lateral width, while in another example case the metal interconnect pathway cross-section demonstrates a profile having a substantially uniform lateral width from top to bottom.

The dielectric layer (ILD) may include any number of conventional dielectric materials commonly used in integrated circuit applications, such as oxides (e.g., silicon dioxide, carbon doped oxide), silicon nitride, or organic polymers (e.g., perfluorocyclobutane or polytetrafluoroethylene), fluorosilicate glass, and organosilicates (e.g., silsesquioxane, siloxane, or organosilicate glass). The dielectric material may be low-k or high-k depending on the desired isolation, and may include pores or other voids to further reduce its dielectric constant. Although only one or two trench/via structures are shown in each layer, the dielectric layer may include any number of such structures. The dielectric layer thickness can vary and in some example embodiments is in the range of 50 nm to 5000 nm. In some embodiments, one dielectric layer may have one thickness and the neighboring dielectric layer can have another thickness. Likewise, in some embodiments, each ILD layer is implemented with the same dielectric material, but in other embodiments, at least some of the ILD layers are implemented with differing dielectric materials. Numerous ILD configurations and dimensions will be apparent in light of this disclosure and the claimed invention is not intended to be limited to any particular configurations and dimensions. As will be appreciated in light of this disclosure, in some cases each ILD layer may have metal interconnect structures formed therein of the same metal materials, and in other cases, at least some of the ILD layers may include differing interconnect metal materials where the interconnect metal materials are different from layer to layer and/or within the same layer.

FIG. 1 further illustrates deposition of a barrier layer on each via/trench recess, in accordance with an embodiment of the present invention. The barrier layer can be, for example, tantalum (Ta), tantalum nitride (TaN), titanium (Ti), titanium nitride (TiN), or combinations thereof deposited using chemical vapor deposition (CVD) or ALD, or other suitable deposition technique, to provide a continuous and conformal barrier layer. The thickness of the barrier layer can vary, and in some such embodiments is in the range of 1 nm to 10 nm (e.g. 3 to 6 nm). In a more general sense, any barrier layer thickness sufficient to prevent the interconnect metal or seed material from diffusing into the ILD can be used. In still other embodiments, no barrier layer is used, such as in cases where the interconnect metal will not diffuse into or otherwise adversely affect the ILD.

Any number of variations can be implemented with respect to the interconnect structure. For instance, in some embodiments, a liner can then be deposited over the barrier layer using CVD or ALD (or other suitable deposition technique), and can be, for example, ruthenium (Ru), cobalt (Co), nickel (Ni), or other material with which the seed layer dopant will not alloy or react. In some example such cases, the liner is deposited using ALD to provide a continuous and conformal liner layer in the range of 1 nm to 5 nm (e.g., 2 to 3 nm). In such example cases, the liner can be used to provide a relatively thin continuous and conformal layer relative to conventional PVD processing, and is highly noble and therefore limits oxidation of the underlying barrier layer. In some such cases, a dopant that is compatible (non-alloying, non-reactive) with the liner can be provided to alloy the seed layer, and allows for dopant segregation at the etch stop (or other protection layer) interface at the top of the seed layer. Note that the barrier and liner layers can be deposited in the same tool without air break. Further note that other embodiments may not have a barrier layer, as the barrier function can be integrated into other parts of the interconnect structure, such as within the liner or the seed layer itself. For example, if a copper-manganese (Cu—Mn) alloyed seed layer is provided, the barrier layer may be eliminated. This is because the Cu—Mn alloy layer may effectively provide the barrier functionality.

Figure 2:
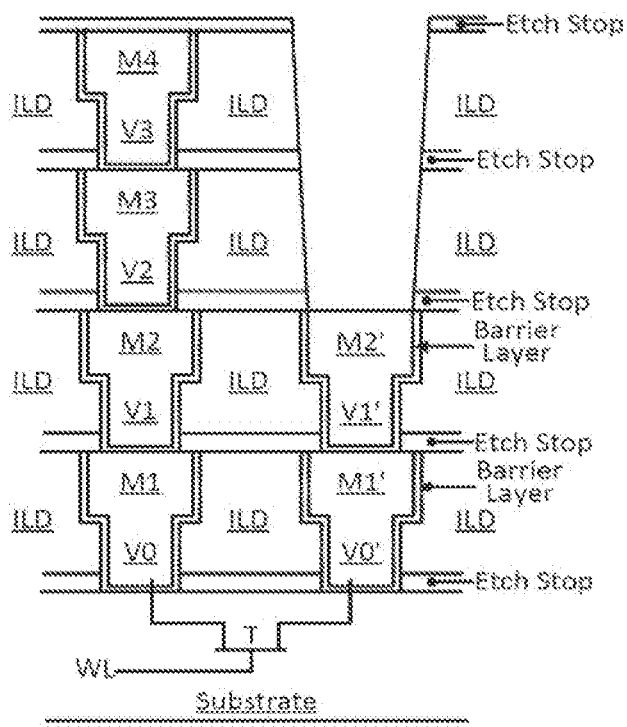
FIG. 2 illustrates the stacked DRAM device of FIG. 1 after capacitor patterning which initially lands on the metal landing pad, in accordance with an embodiment of the present invention.

FIG. 2 illustrates the stacked DRAM device of FIG. 1 after capacitor patterning which initially lands on the metal landing pad, in accordance with an embodiment of the present invention. This initial capacitor trench can be formed in one or more of the dielectric layers, for example, using standard lithography including trench patterning and subsequent etch processes followed by any desired polishing, cleans, etc. The etch processes can be carried out, for instance, using wet and/or dry etch techniques capable of removing the etch stop and ILD materials. As will be appreciated, the dimensions and aspect ratio of the initial capacitor trench can vary, depending on factors such as the desired capacitance. In general, the greater the desired capacitance, the deeper and/or wider the trench. The trench may be tapered (as shown) or not, with the trench shape generally being dependent of the type of etching performed. In one specific example case, the trench is tapered with the upper trench opening is about 20 nm to 150 nm (e.g., 50 to 100 nm) and the lower trench dimension is about 10 nm to 100 nm (e.g., 20 to 50 nm), and the trench has an aspect ratio in the range of about 20:1 to 1:1 (e.g., 10:1). The claimed invention is not intended to be limited to any particular range of dimensions or any particular shape configuration for the initial capacitor trench.

Figure 3:
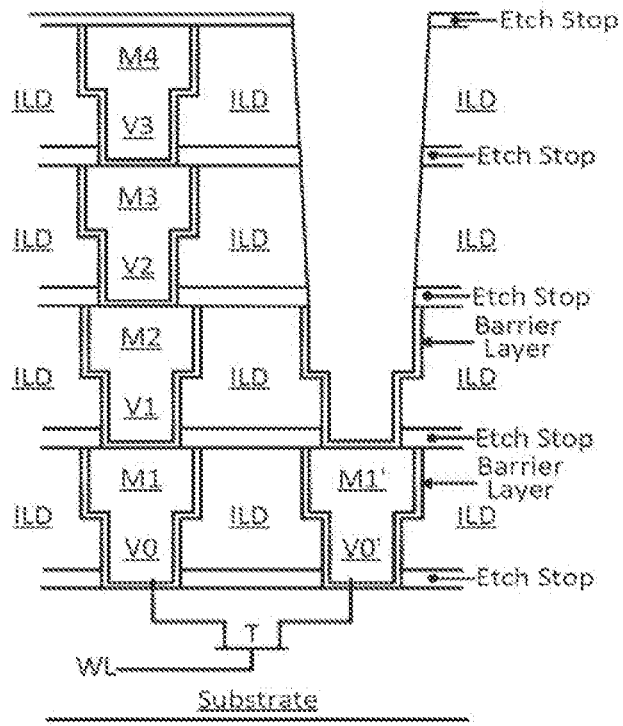
FIG. 3 illustrates the stacked DRAM device of FIG. 2 after removal of the metal landing pad and via upon underlying the initial capacitor trench, in accordance with an embodiment of the present invention.

FIG. 3 illustrates the stacked DRAM device of FIG. 2 after removal of the metal landing pad and via upon underlying the initial capacitor trench, in accordance with an embodiment of the present invention. As previously explained, a typical interconnect metal used for implementing the likes of landing pads, lines, and vias is copper. However, any other suitable interconnect metal or alloy can be used, if so desired. Typical solutions for wet etching of interconnect metals such as copper use acids or chelators that dissolve metal indiscriminately along grain boundaries and exposed surfaces. In accordance with an embodiment of the present invention, the copper or other interconnect metal is removed with a wet etch process that uses an etchant suitable for removing the interconnect metallic material only, but that does not remove the ILD or etch stop materials. In some such embodiments, an oxidizer can be used in conjunction with the etchant, to enhance or otherwise facilitate the metal etch process. Still, in other embodiments, the copper or other interconnect metal can be removed with a wet etch process that uses a combination of etchant, oxidation, and chelating passivators that bind the etched copper using heteroatoms and which then effectively forms a metal-organic passivation layer. This passivation layer is only an intermediate or temporary result of the reaction mechanism, and as the etch proceeds, this layer is washed away into the solution. It effectively slows down or inhibits the etch rate enough to make the etch uniform and keep the dissolved copper in solution.

In some such embodiments, the etchant can be, for example, a mono, di- or tri-carboxylic acid or its derivatives. Citric acid is one specific example of a suitable etchant for selectively removing copper. An optional oxidizer, such as hydrogen peroxide or any other oxidizing agent, can be used to oxidize the copper, which makes it easier for the etchant to remove the copper. For instance, the etchrate of metallic copper without an oxidizer is orders of magnitude slower than with an oxidizer, depending on the etchant chosen and reaction conditions. In some specific such cases, the oxidizer may oxidize the copper to a +1 and then to a +2 oxidation state, depending on conditions such as temperature and duration of oxidation period.

An optional chelating passivator (or inhibitor), such as 1,2,3-benzotriazol can be used to bind any displaced residual copper using heteroatoms and which then form the metal-organic passivation layer, as previously explained. In a more general sense, any heteroatom containing agent capable of forming a passivating polymeric network can be used. In one example such case, the binding of copper using 1,2,3-benzotriazol takes place in +2 oxidation state, but depending on what inhibitor is chosen and as will be appreciated in light of this disclosure, it may bind even in the +1 oxidation state and prevent or slow down further oxidation to +2 state). The temporary or intermediate polymer layer is formed from repeating units of the copper-inhibitor complex. Note that a copper-inhibitor passivation layer on the underlying barrier is not expected. For instance, and in accordance with some embodiments, in the presence of an oxidizer, a tantalum barrier will likely form a protective oxide layer which is fairly unreactive (i.e., copper-inhibitor passivation layer will not bond or otherwise adhere to the oxide). Although fleeting in nature, formation of such an intermediate metal-organic passivation layer will depend, for example, on the percent composition of the inhibitor, amount of dissolved copper (or other interconnect metal), and etch temperature. In one specific example case, the resulting metal-organic passivation has a thickness in the range of 1 nm to 15 nm during the etch process.

In operation, and in accordance with one example embodiment, a solution is created that contains the etchant, oxidizer, inhibitor, and a solvent (e.g., water, propylene carbonate, methylene chloride, glycol ethers, etc, or combinations thereof may be used as solvent). As will be appreciated, the order of mixing depends on the compatibilities of the different components. For instance, the mixing order is very dependent on what etchant, oxidizer and inhibitor combination is chosen and what would provide the maximum etch rate with center to edge uniformity on the wafer. For example, an inhibitor such as 1,2,3-benzotriazol is typically in solid form and may not dissolve (or decompose) if mixed directly with the oxidizer only. Thus, in one specific example case, the citric acid etchant is first diluted in a solvent of water (this prevents precipitation); then the 1,2,3-benzotriazol is added to the dilute solution, followed by the addition of the hydrogen peroxide. In some such example embodiments, the solution can be prepared at a temperature of about 20° C. to 30° C. (e.g., 24° C., +/−2° C.), and contains less than 50 ppm of inhibitor, 0.01% to 1.0% oxidizer by volume (e.g., 0.075 vol %), 3% to 20% etchant by volume (e.g., 5 vol %), and 30% to 95% solvent by volume. The resulting solution or mixture can be sprayed onto or otherwise applied to the wafer while the wafer is spinning, for example, at 50 to 1000 revolutions per minute (e.g., 400 RPM). As the wafer is spinning, the sprayed solution dissolves the copper which stays dissolved in the solution in ionic form. The spin speed can be used to influence the etch rate by controlling the velocity of the liquid on the wafer. In general, the slower the speed, the slower the etch rate. The spinning etch time can vary, and in some example embodiments is in a range anywhere from 60 sec to 600 sec depending on how much copper (or other interconnect metal) needs to be removed.

Figure 4:
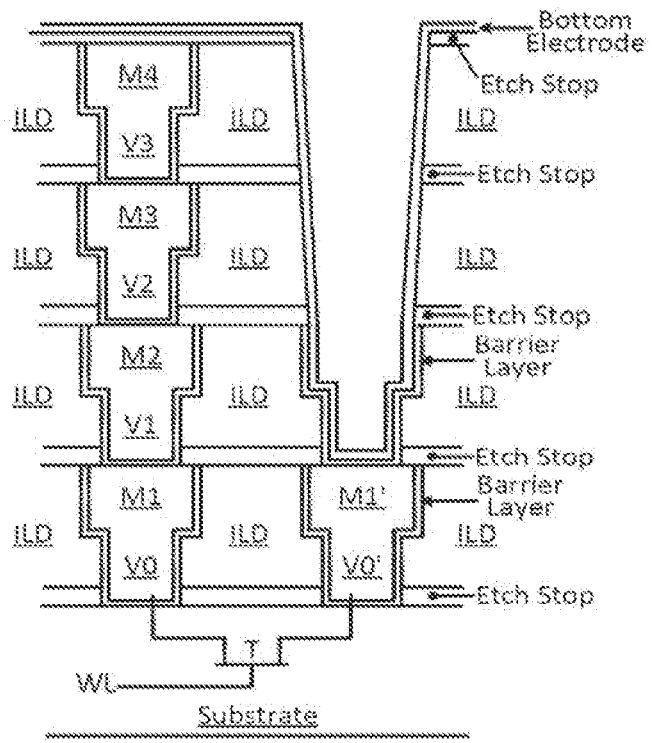
FIG. 4 illustrates the stacked DRAM device of FIG. 3 after deposition of the bottom electrode of the capacitor, in accordance with an embodiment of the present invention.
Figure 5:
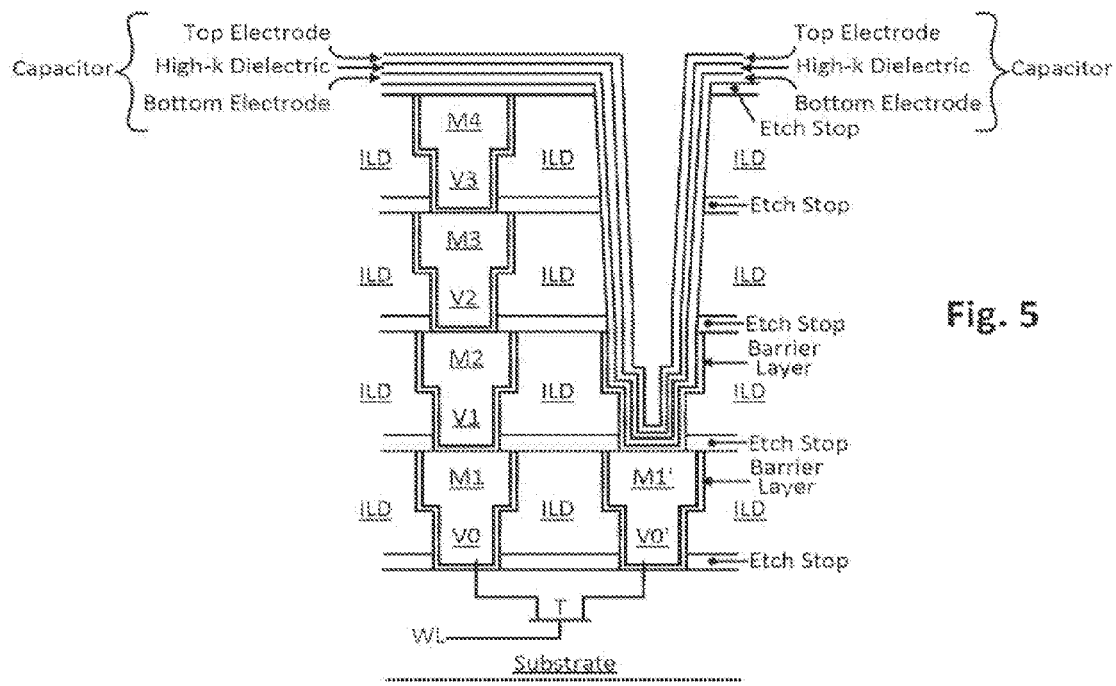
FIG. 5 illustrates the stacked DRAM device of FIG. 4 after deposition of the high-k dielectric and the top electrode of the capacitor, in accordance with an embodiment of the present invention.

FIG. 4 illustrates the stacked DRAM device of FIG. 3 after deposition of the bottom electrode of the capacitor, and FIG. 5 illustrates the stacked DRAM device of FIG. 4 after deposition of the high-k dielectric and the top electrode of the capacitor, in accordance with an embodiment of the present invention. In some embodiments, the capacitor architecture generally includes a metal-insulator-metal (MIM) capacitor configuration, although any suitable conductor-insulator-configuration can be used in accordance with an embodiment of the present invention.

The insulator of the capacitor is typically implemented with a high-k dielectric (to reduce capacitance loss when scaling down capacitor area), but in a more general sense, any dielectric material appropriate for the given application can be used (including dielectric materials such as silicon dioxide and silicon nitride). Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, additional processing may be performed on the high-k dielectric layer, such as an annealing process to improve the quality of the high-k material.

The top and bottom electrodes can be implemented, for example, with any suitable metal or silicon containing layers. In some example embodiments, the top and/or bottom electrodes may include aluminum, carbon, chromium, cobalt, hafnium, iridium, molybdenum, niobium, platinum, ruthenium, poly-silicon, tantalum, titanium, tungsten, vanadium, zirconium, and combinations and/or nitrides or oxides thereof (e.g., iridium oxide, ruthenium oxide, tantalum carbide, tantalum aluminum carbide, tantalum nitride, tantalum aluminum nitride, titanium carbide, titanium nitride, titanium aluminum nitride, and tungsten nitride, to name a few). In addition, and in accordance with some embodiments, note that one or both of the top and bottom electrodes can be a laminated structure or otherwise formed from a plurality of layers (having the same or different materials). Further note that the bottom electrode material and/or configuration may be different from the top electrode material and/or configuration. Any number of conventional or custom electrode configurations can be used in accordance with an embodiment of the present invention, as will be appreciated.

The top and bottom electrode and dielectric material layers can be formed using, for example, ALD or other suitable deposition process that can provide layers that conform to or otherwise cover the capacitor trench walls to the desired thickness. In some specific example embodiments, each of the electrode and dielectric layers of the capacitor may be between around 5 Å to around 200 Å thick (e.g., 20 Å to 50 Å). In general, the thickness of the capacitor layers should be sufficient to electrically isolate the capacitor's bottom and top electrodes so as to allow for the desired capacitor effect.

Figure 6:
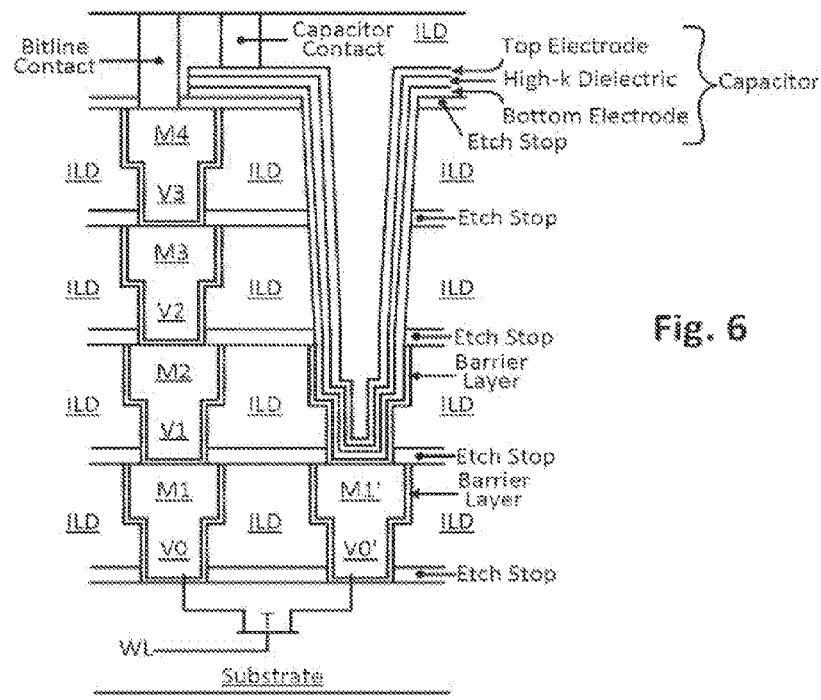
FIG. 6 illustrates the stacked DRAM device of FIG. 5 after contact formation and deposition of interlayer dielectric, in accordance with an embodiment of the present invention.

FIG. 6 illustrates the stacked DRAM device of FIG. 5 after contact formation and deposition of interlayer dielectric, in accordance with an embodiment of the present invention. The contact metal and ILD can be implemented, for example, using conventional or custom processing which may include lithography (e.g., masking/patterning, etc), CVD, ALD, and chemical mechanical planarization (CMP) or polishing. As will be appreciated, the actual contacts can be implemented with numerous layout configurations with respect to, for example, spacing between contacts and coupling of the contacts to the underlying target metal line or deposition. In short, the layout will depend on the particulars of the application and desired device structure. In this example case, the capacitor contact can be coupled to ground, and the bitline contact is provided at the surface of the M4 layer. In other embodiments, the contacts may be provided on different layers.

The contacts can be made of, for example, the same material as the interconnect lines and vias, although they need not be the same as will be appreciated. In one specific example embodiment, each of the contacts and interconnect lines, landing pads, and vias are all implemented with copper. Other suitable interconnect metals can be used as well (e.g., aluminum, gold, silver, titanium, tungsten, or combinations thereof). In short, any metal-containing material (whether elemental or an alloy) providing the desired conductivity can be used to implement the contacts.

Figure 7:
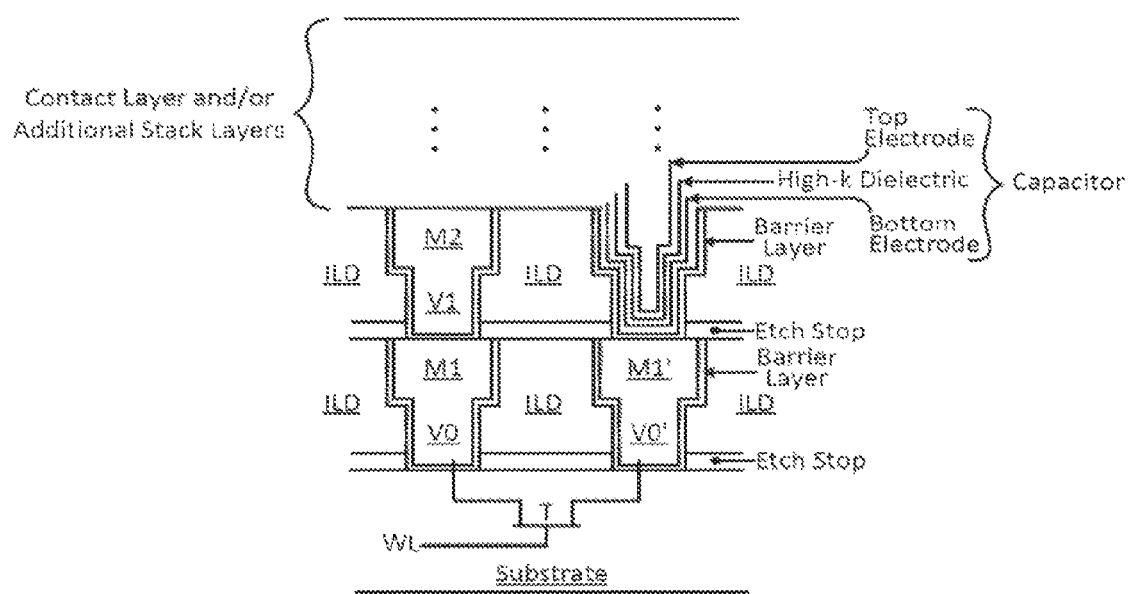
FIG. 7 illustrates a stacked DRAM device configured with a number of contact and/or stack layers, in accordance with an embodiment of the present invention.

FIG. 7 illustrates a stacked DRAM device configured with a number of contact and/or stack layers, in accordance with an embodiment of the present invention. As can be seen, any number of stack layers can be used, and the capacitor may be implemented in any one or more of those layers. Further note that the capacitor may be implemented in one or more layers in the middle of the interconnect stack, such that additional interconnect layers are implemented above and/or below the capacitor layer(s). Various other layers, such as contact layer, diffusion barrier layers, and/or passivation layers may be implemented as desired, given the particular integrated circuit layout design.

Example System

Figure 8:
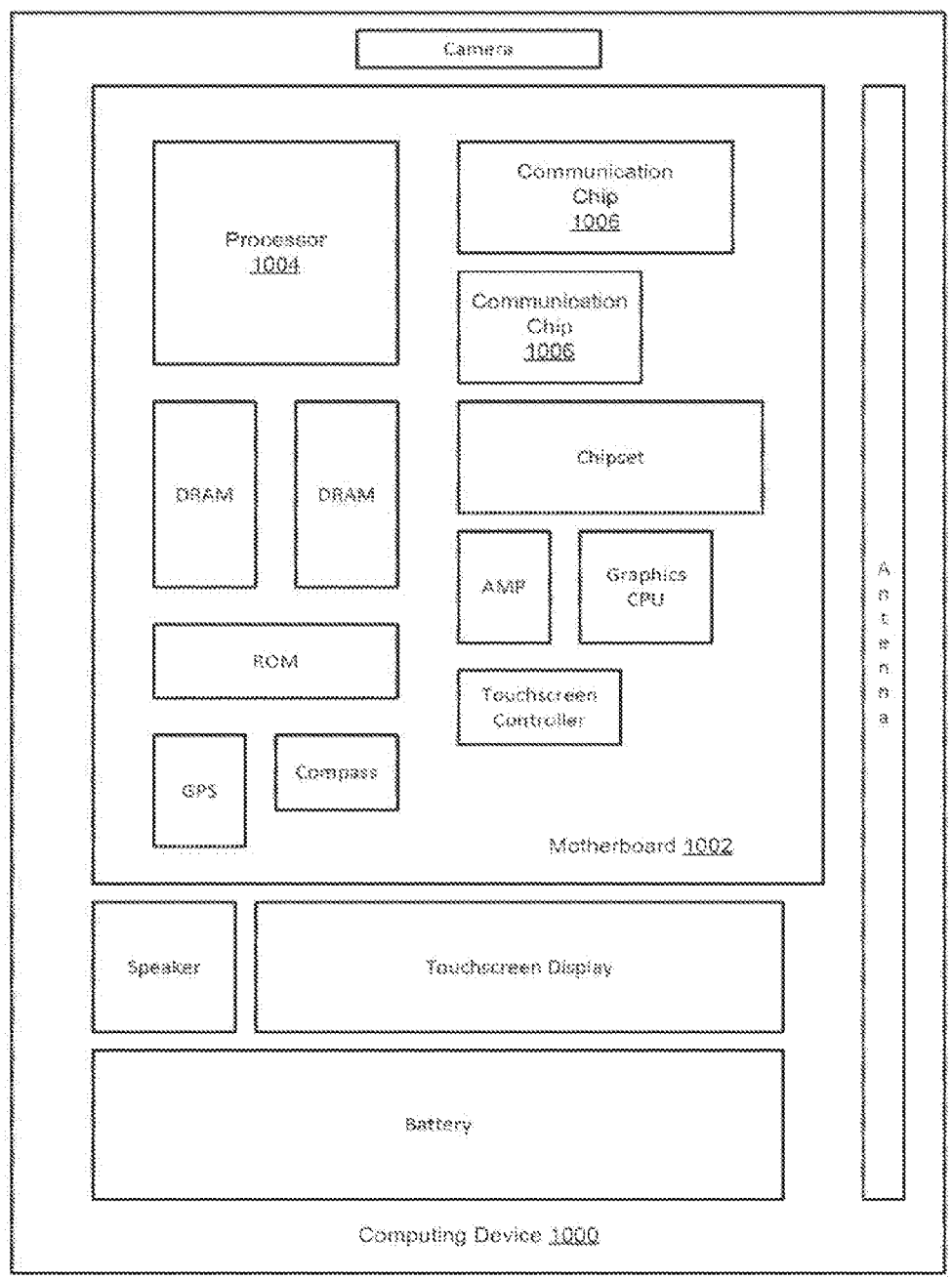
FIG. 8 illustrates a computing system implemented with one or more memory structures in accordance with an example embodiment of the present invention.

FIG. 8 illustrates a computing device 1000 configured in accordance with one embodiment of the invention. As can be seen, the computing device 1000 houses a motherboard 1002. The motherboard 1002 may include a number of components, including but not limited to a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of device 1000, etc. Depending on its applications, computing device 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing device 1000 may include one or more memory structures as described herein. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some embodiments of the present invention, the integrated circuit die of the processor 1004 includes an onboard non-volatile and/or volatile memory or cache, and/or is otherwise communicatively coupled to off-chip memory that is implemented with one or more memory structures as described herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip includes one or more devices implemented with one or more memory structures as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the device 1000 may be any other electronic device that processes data or employs embedded DRAM.

Numerous embodiments will be apparent in light of this disclosure, and features described herein can be combined in any number of configurations. One example embodiment of the present invention provides an integrated circuit device. The device includes a substrate having at least a portion of a dynamic random access memory (DRAM) bit cell circuitry, an interconnect layer on the substrate and including one or more metal-containing interconnect features, and a capacitor at least partly in the interconnect layer and occupying space from which a metal-containing interconnect feature was removed. In one example such case, the space from which a metal-containing interconnect feature was removed includes a diffusion barrier layer (e.g., tantalum, or other suitable diffusion barrier material) upon which at least part of the capacitor is formed. In another example case, the interconnect layer is one of many in a stack of interconnect layers, and two or more of the layers in the stack include one or more metal-containing interconnect features that electrically connect that layer to other layers in the stack. In another example case, the capacitor is at least partly in two or more consecutive layers of the stack. In another example case, the space from which a metal-containing interconnect feature was removed is at least partly in the bottom of the two or more consecutive layers of the stack. In another example case, the interconnect layer further includes a dielectric material in which the one or more metal-containing interconnect features reside. In another example case, the capacitor is configured as a metal-insulator-metal (MIM) capacitor. In another example case, the capacitor comprises a bottom electrode electrically coupled to a transistor of the DRAM bit cell circuitry, a dielectric, and a top electrode. In another example case, the dielectric comprises a high-k dielectric (e.g., such as those having a dielectric constant greater than that of silicon dioxide). In another example case, the DRAM bit cell circuitry comprises a plurality of DRAM bit cells, each cell having an access transistor and a capacitor at least partly occupying space from which a metal-containing interconnect feature was removed. In another example case, the at least one of the metal-containing interconnect features comprise a metal landing pad, a metal line, a via, or a combination thereof (e.g., dual damascene trench structure). In another example case, the metal-containing interconnect features comprise copper (or other suitable interconnect metal). In another example case, the device is a processor. In another example case, the device is a communications device or a computing device.

Another embodiment of the present invention provides an integrated circuit device, which in this example case includes a substrate having at least a portion of a DRAM bit cell circuitry, a stack of interconnect layers on the substrate, and a capacitor at least partly in one or more layers of the stack and occupying a dual damascene trench. Each of the interconnect layers includes a dielectric material, and two or more of the interconnect layers include one or more copper-containing interconnect features that electrically connect that layer to other layers in the stack. The capacitor comprises a bottom electrode electrically coupled to a transistor of the DRAM bit cell circuitry, a dielectric, and a top, electrode. In one example case, the dual damascene trench includes a diffusion barrier layer upon which at least part of the capacitor is formed. In another example case, the DRAM bit cell circuitry comprises a plurality of DRAM bit cells, each cell having an access transistor and a capacitor at least partly occupying space from which a damascene trench. In another example case, the at least one of the metal-containing interconnect features comprise a metal landing pad, a metal line, a via, and/or a combination thereof. For example, some of the metal-containing interconnect features may be single damascene trench structures (e.g., such as a copper landing pad or a via only) and some of the metal-containing interconnect features may be dual damascene trench structures (e.g., such as a copper landing pad and a via).

Another embodiment of the present invention provides a system, which includes a processor integrated circuit and at least one of a communications integrated circuit and/or a display. The processor integrated circuit includes a substrate having at least a portion of a DRAM bit cell circuitry, an interconnect layer on the substrate and including one or more metal-containing interconnect features, and a capacitor at least partly in the interconnect layer and occupying space from which a metal-containing interconnect feature was removed. In one such embodiment, the space from which a metal-containing interconnect feature was removed includes a diffusion barrier layer upon which at least part of the capacitor is formed. In another such embodiment, the interconnect layer is one of many in a stack of interconnect layers, and two or more of the layers in the stack include one or more metal-containing interconnect features that electrically connect that layer to other layers in the stack. In another such embodiment, the capacitor is at least partly in two or more consecutive layers of the stack. In another such embodiment, the capacitor comprises a bottom electrode electrically coupled to a transistor of the DRAM bit cell circuitry, a dielectric, and a top electrode. In another such embodiment, the DRAM bit cell circuitry comprises a plurality of DRAM bit cells, each cell having an access transistor and a capacitor at least partly occupying space from which a metal-containing interconnect feature was removed.

Another embodiment of the present invention provides an integrated circuit device. In this example case, the device includes a substrate having at least a portion of a DRAM bit cell circuitry. The device further includes an interconnect layer on the substrate and including one or more metal-containing interconnect features, each separated from dielectric material of the interconnect layer by a diffusion barrier. The device further includes a capacitor at least partly in the interconnect layer and comprising a bottom electrode, a dielectric, and a top electrode, wherein the bottom electrode is at least partially on a diffusion barrier of the interconnect layer. In one such case, the diffusion barrier layer comprises tantalum. In another such case, the interconnect layer is one of many in a stack of interconnect layers, and two or more of the layers in the stack include one or more metal-containing interconnect features that electrically connect that layer to other layers in the stack, and the capacitor is at least partly in two or more consecutive layers of the stack. In another such case, the bottom electrode is electrically coupled to a transistor of the DRAM bit cell circuitry, and the device is a processor (e.g., central processing unit, microprocessor, or computing device configured with eDRAM) or communications device.

Another embodiment of the present invention provides an integrated circuit device. In this example case, the device includes a substrate having at least a portion of a DRAM bit cell circuitry, an interconnect layer on the substrate and including one or more metal-containing interconnect features in an interconnect pathway, and a capacitor at least partly in the metal interconnect pathway. In one such case, the capacitor is at least partly in a capacitor trench in addition to the metal interconnect pathway. In another such case, the capacitor comprises a bottom electrode, a dielectric, and a top electrode, wherein the bottom electrode is at least partially on a diffusion barrier of the metal interconnect pathway. As will be appreciated in light of this disclosure, the capacitor trench is distinct from the metal interconnect pathway, in that the capacitor trench is specifically provisioned for the capacitor and not metal interconnect features. In contrast, a metal interconnect pathway can be provisioned for one or more metal interconnect features. Thus, and in accordance with some such embodiments, the capacitor occupies space from which a metal-containing interconnect feature was removed.

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. An integrated circuit device, comprising:
   a substrate having at least a portion of a dynamic random access memory (DRAM) bit cell circuitry;
   an interconnect layer on the substrate defining a plurality of interconnect feature spaces, each interconnect feature space of the plurality of interconnect feature spaces having a cross-sectional scale and cross-sectional shape that includes sidewalls and a bottom that is closer to the substrate than the sidewalls;
   one or more metal-containing interconnect features, each occupying a corresponding interconnect feature space of a first set of interconnect feature spaces of the plurality of interconnect feature spaces; and
   one or more capacitor features, each occupying a corresponding interconnect feature space of a second set of interconnect features spaces of the plurality of interconnect feature spaces, each of which also has the cross-sectional scale and the cross-sectional shape, each capacitor feature comprising:
   a bottom electrode, a dielectric, and a top electrode; and
   a diffusion barrier layer conforming to each of the interconnect feature spaces having the cross-sectional shape.

2. The device of claim 1 wherein the diffusion barrier layer comprises tantalum.

3. The device of claim 1 wherein the interconnect layer is one of many in a stack of interconnect layers, and one or more metal-containing interconnect features of one of the interconnect layers electrically connect that layer to other interconnect layers in the stack.

4. The device of claim 3 wherein each of the lower electrode, dielectric, and upper electrode of the capacitor feature is at least partly in two or more consecutive layers of the stack.

5. The device of claim 4 wherein the second space is at least partly in the bottom of the two or more consecutive layers of the stack.

6. The device of claim 1 wherein the interconnect layer further includes a dielectric material in which the one or more metal-containing interconnect features reside.

7. The device of claim 1 wherein the capacitor feature is configured as a metal-insulator-metal (MIM) capacitor.

8. The device of claim 1 wherein the bottom electrode is electrically coupled to a transistor of the DRAM bit cell circuitry.

9. The device of claim 1 wherein the dielectric comprises a high-k dielectric having a dielectric constant greater than that of silicon dioxide.

10. The device of claim 1 wherein the bottom electrode is electrically coupled to a transistor of the DRAM bit cell circuitry, the DRAM bit cell circuitry comprising a plurality of DRAM bit cells, each cell having an access transistor and a capacitor at least partly occupying space of the interconnect layer.

11. The device of claim 1 wherein at least one of the metal-containing interconnect features comprise a metal landing pad, a metal line, a via, or a combination thereof.

12. The device of claim 1 wherein the device is a processor, a communications device, or a computing device.

13. A system, comprising:
   a processor integrated circuit comprising the device of claim 1; and
   at least one of a communications integrated circuit and a display.

14. The integrated circuit device of claim 1, wherein the cross-sectional shape is a dual damascene shape that includes a first width corresponding to a metal line and an adjacent second width less than the first width corresponding to a via.

15. The integrated circuit device of claim 1, wherein the cross-sectional shape includes:
   a tapered portion having a uniformly decreasing width; and a dual damascene shaped structure having a first width corresponding to a metal line and an adjacent second width less than the first width corresponding to a via; and wherein the tapered portion tapers down to the dual damascene shaped structure.

16. The integrated circuit device of claim 1, wherein the cross-sectional shape has an aspect ratio of from 5:1 to 10:1.

17. An integrated circuit device, comprising:
a substrate having at least a portion of a dynamic random access memory (DRAM) bit cell circuitry;
an interconnect layer on the substrate defining a plurality of interconnect feature spaces, each interconnect feature space of the plurality of interconnect feature spaces having a cross-sectional scale and cross-sectional shape that includes sidewalls and a bottom that is closer to the substrate than the sidewalls;
one or more metal-containing interconnect features, each occupying a corresponding interconnect feature space of a first set of interconnect feature spaces of the plurality of interconnect feature spaces, wherein each metal-containing interconnect feature is separated from insulator material of the interconnect layer by a diffusion barrier conforms to each of the interconnect feature spaces of the plurality of interconnect feature spaces defined by the interconnect layer; and
one or more capacitors, each occupying a corresponding interconnect feature space of a second set of interconnect features spaces of the plurality, each of which also has the cross-sectional scale and cross-sectional shape, each capacitor comprising:
a bottom electrode, a dielectric, and a top electrode wherein the bottom electrode is also separated from the insulator material of the interconnect layer by the diffusion barrier of the interconnect layer conforming to each of the interconnect features spaces of the plurality of interconnect feature spaces defined by the interconnect layer.

18. The device of claim 17 wherein the interconnect layer is one of many in a stack of interconnect layers, and one or more metal-containing interconnect features of one of the interconnect layers electrically connect that layer to other layers in the stack, and the capacitor is at least partly in two or more consecutive layers of the stack.

19. The device of claim 17 wherein the bottom electrode is electrically coupled to a transistor of the DRAM bit cell circuitry, and the device is a processor or communications device.

20. The integrated circuit device of claim 17, wherein the cross-sectional shape of each interconnect feature space of the plurality of interconnect features spaces comprises a dual damascene shaped structure that includes a first width corresponding to a metal line and an adjacent second width less than the first width corresponding to a via.

21. The integrated circuit device of claim 20, wherein the cross-sectional shape of the one or more capacitors further includes:
a tapered portion having a width that decreases from a top of the tapered portion to a bottom of the tapered portion,
wherein the tapered portion tapers down to the dual damascene shaped structure.

22. An integrated circuit device, comprising:
a substrate having at least a portion of a dynamic random access memory (DRAM) bit cell circuitry including a transistor;
an interconnect layer on the substrate defining a plurality of interconnect pathways, each interconnect pathway of the plurality of interconnect pathways having a cross-sectional scale and cross-sectional shape that includes sidewalls and a bottom that is closer to the substrate than the sidewalls;
one or more metal-containing interconnect features, each occupying an interconnect pathway of a first set of interconnect pathways of the plurality of interconnect pathways; and
one or more capacitors, each occupying a corresponding interconnect pathway of a second set of interconnect pathways of the plurality of interconnect pathways, each capacitor comprising:
a bottom electrode, a dielectric, and a top electrode; and
a diffusion barrier conforming to the cross-sectional shape of each interconnect pathway of the plurality of interconnect pathways.

23. The device of claim 22 wherein the capacitor is at least partly in a capacitor trench above and in addition to the interconnect pathway of the second set of interconnect pathways.

24. The device of claim 22 wherein the bottom electrode is at least partially on a diffusion barrier of the interconnect pathway of the second set of interconnect pathways.

25. The integrated circuit device of claim 22, wherein the cross-sectional shape of each interconnect pathway of the plurality of interconnect pathways comprises a dual damascene shaped structure that includes a first width corresponding to a metal line and an adjacent second width less than the first width corresponding to a via.

26. The integrated circuit device of claim 25, wherein cross-sectional shape of the one or more capacitors each include:
a tapered portion having width that decreases from a top of the tapered portion to a bottom of the tapered portion;
wherein the tapered portion tapers down to the dual damascene shaped structure.

27. An integrated circuit device, comprising:
a substrate having at least a portion of a dynamic random access memory (DRAM) bit cell circuitry including a transistor;
a stack of interconnect layers on the substrate, each layer defining a plurality of interconnect feature spaces, each of which has a cross-sectional scale and cross-sectional shape defining a dual damascene trench that includes sidewalls and a bottom that is closer to the substrate than the sidewalls, wherein each of the interconnect layers includes a dielectric material
one or more copper-containing interconnect features, each occupying a corresponding first interconnect feature space in an interconnect layer of the stack; and
a capacitor occupying a corresponding second interconnect feature space also having the cross-sectional scale and cross-sectional shape defining the dual damascene trench, the second interconnect feature space also in an interconnect layer of the stack, the capacitor comprising:
a bottom electrode, a dielectric, and a top electrode, wherein the bottom electrode is electrically coupled to a transistor of the DRAM bit cell circuitry, wherein the dual damascene trench includes a diffusion barrier layer upon which at least part of the capacitor is formed.

28. The device of claim 27 wherein the DRAM bit cell circuitry comprises a plurality of DRAM bit cells, each cell having an access transistor and a capacitor at least partly occupying a damascene trench.

29. The device of claim 27 wherein at least one of the metal-containing interconnect features comprise a metal landing pad, a metal line, a via, or a combination thereof.

30. The integrated circuit device of claim 27, wherein the cross-sectional shape of each interconnect feature space of the plurality of interconnect features spaces comprises a dual damascene shaped structure that includes a first width corresponding to a metal line and an adjacent second width less than the first width corresponding to a via.

31. The integrated circuit device of claim 30, wherein the capacitor further includes:
   a tapered portion having a width that decreases from a top of the tapered portion to a bottom of the tapered portion,
   wherein the tapered portion tapers down to the dual damascene shaped structure.

* * * * *